United States Patent [19]

Bosch et al.

[11] Patent Number: 5,642,081
[45] Date of Patent: Jun. 24, 1997

[54] FMCW VCO CLOSED LOOP LINEARIZER

[75] Inventors: Donald M. Bosch, Plymouth; Steven J. Loughran, Eden Prairie; Ronald D. Jesme, Minneapolis, all of Minn.

[73] Assignee: Alliant Techsystems Inc., Hopkins, Minn.

[21] Appl. No.: 548,428

[22] Filed: Oct. 26, 1995

[51] Int. Cl.⁶ .............................. H03L 7/08; H03B 23/00; G01S 13/32
[52] U.S. Cl. .............................. 331/4; 331/17; 342/200
[58] Field of Search .............................. 331/4, 17, 18, 331/25, DIG. 2; 327/156; 342/83, 128, 200; 455/260

[56] References Cited

U.S. PATENT DOCUMENTS

| | | | |
|---|---|---|---|
| 3,657,558 | 4/1972 | Patrickson | 307/228 |
| 3,783,392 | 1/1974 | Drake et al. | 328/127 |
| 4,430,641 | 2/1984 | Baur et al. | 340/347 DA |
| 4,539,565 | 9/1985 | Norsworthy | 343/14 |
| 4,593,287 | 6/1986 | Nitardy | 343/17.5 |
| 4,754,277 | 6/1988 | Voyce | 331/4 X |
| 5,189,427 | 2/1993 | Stove et al. | 342/128 |
| 5,379,001 | 1/1995 | Hedtke | 331/4 |

*Primary Examiner*—David Mis
*Attorney, Agent, or Firm*—Vidas, Arrett & Steinkraus

[57] ABSTRACT

The present invention overcomes the problems discussed above by providing a linearizer apparatus for providing a linear ramp modulation for a voltage control oscillator (VCO), including voltage controlled oscillator means (VCO) having input and output terminals, and means for producing the output signal at its output terminal at the output frequency such that the output frequency corresponds to the voltage of a modulated tuning signal applied to the input terminal. A signal division means is coupled to the output of the VCO for producing a divided signal. A glass bulk acoustic delay means is coupled to the signal division means for producing a delayed signal. A first comparison signal generator means is coupled to the divided signal and the delayed signal for producing an IF signal which is proportional to the VCO output signal non-linearities. A reference oscillator means is provided for producing a reference signal. A second comparison signal generator means is coupled to the reference signal and the IF signal for producing an error signal. Finally, a summing means is coupled to a modulation waveform generator means and the error signal for producing a modulated tuning signal which is input to the VCO to frequency modulate the VCO.

15 Claims, 1 Drawing Sheet

FMCW VCO CLOSED LOOP LINEARIZER

BACKGROUND OF THE INVENTION

1. Field of the Invention

The present invention relates to the field of electronic radar, and more particularly to apparatus for providing a highly linear ramp modulation for a voltage controlled oscillator (VCO).

2. Description of the Related Art

An frequency modulated continuous wave (FMCW) radar system often uses a linear frequency modulation to provide accurate range information. The resolution of the ranging information is directly dependent on the linearity of the transmit signal. However, the performance output of a voltage controlled oscillator (VCO) used to generate the radar signal is typically non-linear. Therefore, special effort must be taken to insure that the control voltage for the VCO produces the desired linear modulation ramp output slope.

Existing long range millimeter-wave (MMW) FMCW radars utilize surface acoustic wave (SAW) delay line linearizers. SAW delay line systems are not practical for missile and artillery systems due to high-G survivability requirements and size and cost constraints. These devices typically down-converted a MMW VCO to a microwave delay line linearizer, such as a SAW. Other methods down-convert and then divide to a digital or L-C delay line, which exhibits poor discriminator linearity which severely limits the radar range resolution.

U.S. Pat. No. 5,379,001, entitled "Closed Loop Linearizer For Ramp Modulated VCO", issued Jan. 3, 1995 to applicant is directed to a closed loop linearizer which takes a digital count and error correction of time segmented modulation ramp approach. The entire contents of U.S. Pat. No. 5,379,001 are hereby incorporated by reference. While this approach provides improved linearity over open loop techniques (i.e. DDM), there are still several drawbacks to using this counting approach. The digital counting approach offers low cost for high volume applications but does not provide adequate linearity for long range seeker applications.

What is needed is a linearizer which replaces the more expensive higher frequency surface acoustic wave delay system with a lower cost, high-G survivable, small linearizer, while maintaining high linearity.

SUMMARY OF THE INVENTION

Applicants' have overcome the problems of the prior art by inventing a linearizer which divides the frequency of a microwave VCO. At low frequencies, glass bulk acoustic delay devices can be used for the dr/tit delay line discriminator to linearize the VCO. The linearized source is then up-converted to the desired MMW frequency. Prior methods down-converted a MMW VCO to a microwave delay line linearizer, which is cost, high-G and size prohibitive.

The present invention overcomes the problems discussed above by providing a linearizer apparatus for providing a linear ramp modulation for a voltage control oscillator (VCO), including voltage controlled oscillator means (VCO) having input and output terminals, and means for producing the output signal at its output terminal at the output frequency such that the output frequency corresponds to the voltage of a modulated tuning signal applied to the input terminal. A signal division means is coupled to the output of the VCO for producing a divided signal. A glass bulk acoustic delay means is coupled to the signal division means for producing a delayed signal. A first comparison signal generator means is coupled to the divided signal and the delayed signal for producing an IF signal which is proportional to the VCO output signal non-linearities. A reference oscillator means is provided for producing a reference signal. A second comparison signal generator means is coupled to the reference signal and the IF signal for producing an error signal. Finally, a summing means is coupled to a modulation waveform generator means and the error signal for producing a modulated tuning signal which is input to the VCO to frequency modulate the VCO.

The VCO may be a microwave VCO with a frequency of 5 GHz, and its output can be up-converted to the desired MMW frequency. The 5 GHz signal can be divided by 64 to produce a divided signal which has a low enough frequency to permit an inexpensive glass bulk acoustic delay device to be used as a delay. GaAs prescalers may be used to produce the divided signal. Bulk acoustic wave devices are lower cost than SAW delay devices, have higher temperature stability which eliminates the heater requirement and are high-G survivable. The modulation waveform generator may be a sawtooth wave generator. The linearizer may also include a notch filter means coupled to the output of the summing means to filter the modulated tuning signal, which is input to the VCO. Although the inventive linearizer apparatus can be used in many applications, it is particularly useful in artillery and missile systems which require small size, low cost for high volume cost sensitive applications and high-G survivability.

Applicant has found that the present invention allows for a linearizer which is a 30:1 reduction over applicants' previous linearizer devices. Applicant has also found that the present invention provides superior linearity over frequency discrimination or counting methods for long range seeker applications (i.e. greater than 1 Km). The architecture of the current invention allows incorporation of a silicon VCO and DRO local oscillator for receiver sensitivity. The present invention may be potted for high-G applications. The glass bulk acoustic delay is less expensive than higher frequency devices and is temperature stable.

BRIEF DESCRIPTION OF THE DRAWINGS

A detailed description of the invention is hereafter described with specific reference being made to the drawings in which:

The FIGURE is a block diagram showing the high level architecture of a preferred embodiment of the FMCW VCO closed loop linearizer.

DESCRIPTION OF THE PREFERRED EMBODIMENTS

Figure 1:
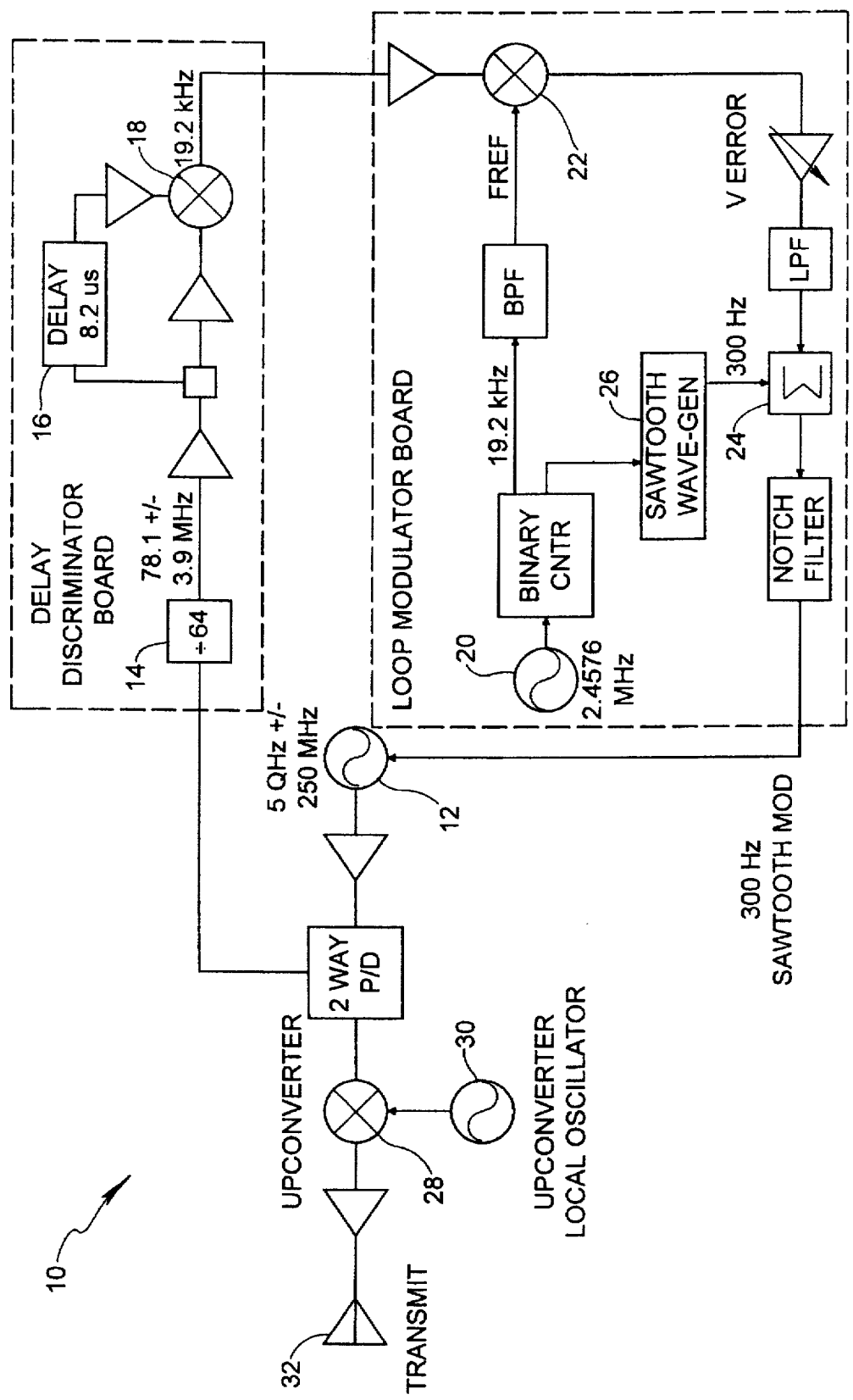

While this invention may be embodied in many different forms, there are shown in the drawings and described in detail herein specific preferred embodiments of the invention. The present disclosure is an exemplification of the principles of the invention and is not intended to limit the invention to the particular embodiments illustrated.

The FIGURE shows a high level block diagram of the inventive FMCW VCO closed loop linearizer and is referred to generally at 10. A 5 GHz low phase noise silicon microwave VCO is the FM source, shown at 12. The 5 GHz source frequency signal is divided down by a factor of 64 to approximately 78.1 MHz at 14. In the preferred embodiment GaAs prescalers are used to divide down the frequency of the microwave VCO. The divided signal is then split and passed through a glass bulk acoustic delay device, shown at 16. The delayed signal is compared to the divided signal at 18, which produces an IF signal which is proportional to the 5 GHz source non-linearities.

A crystal frequency reference oscillator 20 provides a reference signal which is compared to the IF signal at 22 to produce an error voltage signal. The error voltage signal is summed at 24 with a sawtooth modulation waveform, generated with sawtooth wave generator 26 to produce a tuning signal. The tuning signal is then passed through a notch filter to remove the image frequency of the tuning signal. The filtered tuning signal then frequency modulates the VCO to close the loop. The binary counter generates a reference frequency and modulation control signals. A reference oscillator is used as an input to the binary counter to provide stable output signals. In the preferred embodiment the modulation waveform has a period which is an integer multiple of the reference frequency's period.

The voltage controlled oscillator 12 has the filtered tuning signal applied to its input terminal for producing the output signal at its output terminal such that the output frequency of the VCO corresponds to the voltage of a modulated tuning signal applied to the input terminal. The output of the VCO 12 is then up-converted to the desired MMW frequency at 28 using upconverter local oscillator 30 to provide the linearized transmit signal at 32.

It should be understood that although a sawtooth modulation waveform is described in connection with the preferred embodiment, that other frequency modulation forms such as a triangle form may be utilized in the present invention. It should also be understood that the invention could be embodied with other values chosen for the VCO 12, the division factor of divider 14, the delay value of 16, and the reference frequency of oscillator 20. The critical feature of the present invention is that the divided down signal have a frequency low enough to permit the use of a glass bulk acoustic delay device 16.

This completes the description of the preferred and alternate embodiments of the invention. It is to be understood that even though numerous characteristics and advantages of the present invention have been set forth in the foregoing description, together with the details of the structure and function of the invention, the disclosure is illustrative only and changes may be made in detail, especially in matters of shape, size and arrangement of parts within the principals of the invention, to the full extent indicated by the broad, general meaning of the terms in which the appended claims are expressed. Those skilled in the art may recognize other equivalents to the specific embodiment described herein which are intended to be encompassed by the claims attached hereto.

What is claimed is:

1. A linearizer apparatus for providing a linear ramp modulation for a voltage control oscillator (VCO), the apparatus comprising:

voltage controlled oscillator means (VCO) having input and output terminals, and means for producing the output signal at its output terminal at the output frequency such that the output frequency corresponds to the voltage of a modulated tuning signal applied to the input terminal;

signal division means coupled to the output of the VCO for producing a divided signal;

glass bulk acoustic delay means coupled to the signal division means for producing a delayed signal;

first comparison signal generator means coupled to the divided signal and the delayed signal for producing an IF signal which is proportional to the VCO output signal non-linearities;

reference oscillator means for producing a reference signal;

second comparison signal generator means coupled to the reference signal and the IF signal for producing an error signal;

summing means coupled to a modulation waveform generator means and the error signal for producing a modulated tuning signal which is input to the VCO to frequency modulate the VCO.

2. The linearizer apparatus of claim 1 wherein the VCO is a microwave VCO and further including up-converting means for up-converting the output of the microwave VCO to a predetermined millimeter-wave frequency.

3. The linearizer apparatus of claim 1 wherein the VCO is a microwave VCO.

4. The linearizer apparatus of claim 3 wherein the frequency of the microwave VCO is approximately 5 GHz.

5. The linearizer apparatus of claim 3 wherein the divided signal is at a low frequency relative to the VCO output signal so as to permit the use of the glass bulk acoustic delay means to produce the delay signal.

6. The linearizer apparatus of claim 5 wherein the divided signal is approximately 78 MHz.

7. The linearizer apparatus of claim 4 wherein the divided signal is approximately 1/64 the frequency of the 5 GHz VCO output signal.

8. The linearizer apparatus of claim 7 wherein the signal division means includes GaAs prescalers to produce the divided signal.

9. The linearizer apparatus of claim 1 wherein the modulation waveform generator is a sawtooth wave generator.

10. The linearizer apparatus of claim 9 further including a notch filter means coupled to the output of the summing means to filter the modulated tuning signal, which is input to the VCO.

11. The linearizer apparatus of claim 1 for use in an artillery system.

12. The linearizer apparatus of claim 1 for use in a missile system.

13. The linearizer apparatus of claim 1 wherein the modulation waveform has a period which is an integer multiple of the reference signals period.

14. A closed loop linearizer including the elements of a voltage controlled oscillator (VCO) which is frequency modulated by a tuning signal, the improvement comprising:

signal division means coupled to the output of the VCO for producing a divided signal, and glass bulk acoustic delay means coupled to the signal division means for producing a delayed signal, the delay signal being utilized to provide the frequency modulating tuning signal input to the VCO.

15. A closed loop linearizer including the elements of a voltage controlled oscillator (VCO) which is frequency modulated by a tuning signal, the improvement comprising:

signal division means coupled to the output of the VCO for producing a divided signal;

glass bulk acoustic delay means coupled to the signal division means for producing a delayed signal, and circuit means for utilizing the delay signal to provide the frequency modulating tuning signal input to the VCO.

* * * * *

UNITED STATES PATENT AND TRADEMARK OFFICE
CERTIFICATE OF CORRECTION

PATENT NO. : 5,642,081

DATED : June 24, 1997

INVENTOR(S) : Donald M. Bosch, Steven J. Loughran, Ronald D. Jesme

It is certified that error appears in the above-identified patent and that said Letters Patent is hereby corrected as shown below:

Col. 1, line 51, delete "dr/tit" and insert therefor -- df/dt --

Signed and Sealed this

Twenty-sixth Day of August, 1997

*Attest:*

BRUCE LEHMAN

*Attesting Officer*  *Commissioner of Patents and Trademarks*